(12) United States Patent
Furusawa et al.

(10) Patent No.: US 6,518,087 B1
(45) Date of Patent: Feb. 11, 2003

(54) METHOD FOR MANUFACTURING SOLAR BATTERY

(75) Inventors: Masahiro Furusawa, Suwa (JP); Shunichi Seki, Suwa (JP); Satoru Miyashita, Suwa (JP); Tatsuya Shimoda, Suwa (JP); Ichio Yudasaka, Chimo (JP); Yasuo Matsuki, Yokkaichi (JP); Yasumasa Takeuchi, Yokohama (JP)

(73) Assignees: Seiko Epson Corporation, Tokyo (JP); JSR Corporation, Tokyo (JP)

( * ) Notice: Subject to any disclaimer, the term of this patent is extended or adjusted under 35 U.S.C. 154(b) by 0 days.

(21) Appl. No.: 09/701,646

(22) PCT Filed: Mar. 29, 2000

(86) PCT No.: PCT/JP00/01989

§ 371 (c)(1),
(2), (4) Date: Nov. 30, 2000

(87) PCT Pub. No.: WO00/59044

PCT Pub. Date: Oct. 5, 2000

(30) Foreign Application Priority Data

Mar. 30, 1999 (JP) .............................................. 11-090313

(51) Int. Cl.$^7$ .......................... H01L 21/00; H01L 21/20
(52) U.S. Cl. ............................. 438/96; 438/97; 438/502
(58) Field of Search .............................. 438/57, 69, 72, 438/96, 97, 98, 478, 479, 482, 488, 500, 502

(56) References Cited

U.S. PATENT DOCUMENTS 4,704,444 A   11/1987   Brown-Wensley et al.
5,866,471 A   2/1999    Beppu et al.

FOREIGN PATENT DOCUMENTS

| GB | 2 077 710 A | 12/1981 |
|----|-------------|---------|
| JP | 64-29661    | 1/1989  |
| JP | 6-132552    | 5/1994  |
| JP | 7-267621    | 10/1995 |
| JP | 09237927    | * 9/1997 |
| JP | 10-321536   | 12/1998 |
| JP | 2000-31066  | 1/2000  |
| WO | 89/00341    | 1/1989  |

OTHER PUBLICATIONS

T. R. Hebner et al..; "Ink–jet Printing of Doped Polymers for Organic Light Emitting Devices"; American Institute of Physics, vol. 72, No. 5; Feb. 2, 1998; pp. 519–521.

"Substitutional Doping of Amorphous Silicon", W.E. Spear et al., Solid State Communications, vol. 17, pp. 1193–1196, 1975.

"Advances in Deposition Processes for Passivation Films", Werner Kern et al., J. Vac. Sci, Technology, vol. 14, No. 5, pp. 1082–1099, Sep./Oct., 1997.

* cited by examiner

Primary Examiner—Keith Christianson
(74) Attorney, Agent, or Firm—Oliff & Berridge, PLC (57) ABSTRACT

A solar battery is provided having a structure in which at least two semiconductor thin-films are disposed one over the other between a pair of electrodes, each semiconductor thin-film differing from the other in the impurity concentration thereof and/or the type of semiconductor. Formation of at least one of the semiconductor thin-films consists of coating a liquid coating composition containing a silicon compound so as to form a coating film and a step of converting the coating film into a silicon film by heat treatment and/or light treatment.

16 Claims, 5 Drawing Sheets

METHOD FOR MANUFACTURING SOLAR BATTERY

BACKGROUND OF THE INVENTION

1. Field of the Invention

The present invention relates to a method for manufacturing a novel solar battery.

2. Description of the Related Art

Conventionally, as methods for manufacturing amorphous silicon films and polycrystalline silicon films used for manufacturing solar batteries, methods, such as thermal chemical vapor deposition (CVD), plasma CVD, and photo CVD, have been employed using a monosilane or a disilane gas, and generally, thermal CVD (refer to J. Vac. Sci. Technology., vol. 14, p. 1,082, 1977) and plasma CVD (refer to Solid State Com., vol. 17, p. 1193, 1975) are widely used for polycrystalline silicon and amorphous silicon, respectively.

SUMMARY OF THE INVENTION

However, in the formation of silicon films by CVD methods, there are problems in that, for example, production yield is low due to contamination of apparatuses or generation of foreign materials caused by silicon particles formed in a gas phase since gas phase reactions occur in CVD processes, a film having uniform thickness is difficult to obtain on a surface having concavo-convex areas since starting materials are gases, productivity is low since the growth rates of films are low, and complicated and expensive high-frequency generators and vacuum apparatuses are required for plasma CVD. Accordingly, further improvements of formation of silicon films have been strongly desired.

In addition, handling of starting materials is difficult since not only silicon hydrides in gas forms having strong toxicity and strong reactivity are used for CVD, but also a sealed vacuum apparatus is required since starting materials are gases. In general, the apparatus mentioned above is large and is not only expensive itself, but also large amounts of energy are consumed by the vacuum system and/or plasma generation system equipped with the apparatus, resulting in increase in production cost.

Recently, methods are proposed in which silicon hydrides in liquid forms are coated without using a vacuum system. In Japanese Unexamined Patent Application Publication No. 1-29661, a method for forming a silicon-based thin film is disclosed, in which a starting material in a gas form is liquified and adsorbed on a cooled substrate, and chemically reactive atomic hydrogen is reacted therewith so as to form a silicon-based thin film. However, there are problems in that a complicated apparatus is not only required which sequentially performs vaporization and cooling of a silicon hydride used as a starting material, but also, control of the film thickness is difficult.

In addition, in Japanese Unexamined Patent Application Publication No. 7-267621, a method is disclosed, in which a low molecular weight silicon hydride in a liquid form is coated on a substrate. However, the system of the method is unstable, and in addition, since the material is in a liquid form, a uniform coating thickness is difficult to obtain when the method is applied to a large substrate.

In British Patent No. GB-2077710A, an example of a solid polymer composed of silicon hydrides is disclosed. However, since the solid polymer mentioned above is insoluble in a solvent, a film cannot be formed therefrom by coating.

In addition, when the silicon semiconductor film described above is used for solar battery, in general, the silicon semiconductor film must be used as a p-type or an n-type semiconductor doped with atoms in Group III or Group V of the periodic table. Since the doping mentioned above is conventionally performed by thermal diffusion or ion implantation after a silicon film is formed, it must be performed in vacuum, process control thereof is complicated, and in particular, a doped silicon film is difficult to form uniformly on a large substrate.

In contrast, Japanese Unexamined Patent Application Publication No. 9-237927 discloses a method in which a solution containing a polysilane is coated on a substrate and is subsequently pyrolyzed so that silicon atoms are isolated. In the same publication as described above, as a method for forming an n-type or a p-type silicon thin film which is necessary for solar batteries, a method in which a coating film formed of a polysilane solution containing an alkyl compound, which imparts p-type or n-type conductivity, is pyrolyzed and a method in which a coating film formed from a polysilane solution is pyrolyzed in an environment containing a dopant source are disclosed. However, in the former, a uniformly doped silicon film may not be formed in some cases due to the difference in solubility of the polysilane and the alkyl compound containing a dopant, or since large amounts of carbon atoms remain in the silicon film finally formed due to carbon atoms contained in the alkyl compound, electric properties of the silicon film are degraded. In addition, in the latter, there is a problem in that a dopant amount is difficult to control.

Solar batteries, in which silicon thin films, which are necessary for solar battery manufacturing, are formed by coating using coating compositions containing silane compounds followed by heat, light, or laser treatment so that large solar batteries are easily manufactured at low cost. In addition, another object of the present invention is to provide a totally novel method for manufacturing solar batteries, in which thin films used for solar batteries other than silicon films are also formed by coating liquid materials followed by heating.

Through intensive research by the inventors of the present invention to accomplish the objects described above, the inventors of the present invention discovered a method in which large solar batteries could be manufactured at lower cost, and as a result, the present invention was completed. That is, according to the present invention, a method for manufacturing a solar battery having a structure in which at least two semiconductor thin films are disposed one over the other between a pair of electrodes, each semiconductor thin film differing from the other in the impurity concentration thereof and/or the type of semiconductor, may consist of a step of coating a liquid coating composition containing a silicon compound so as to form a coating film and a subsequent step of converting the coating film into a silicon film by heat treatment and/or light treatment.

In the method for manufacturing a solar battery of the present invention, which has a structure in which at least two semiconductor thin films are disposed one over the other between a pair of electrodes, each semiconductor thin film differing from the other in the impurity concentration thereof and/or the type of semiconductor, the formation of at least one of the semiconductor thin films may consist of, a step of coating a liquid coating composition containing a silicon compound so as to form a coating film and a subsequent step of converting the coating film into a silicon film by heat treatment and/or light treatment.

In a preferable embodiment of the method for manufacturing a solar battery, according to the present invention, as the liquid coating composition described above, a coating composition is used which may consist of, a solvent and a cyclic silicon compound (in particular, a silane compound) represented by the formula $Si_nX_m$ (X stands for a hydrogen atom and/or a halogen atom, the subscript n stands for an integer of 5 or more, and the subscript m stands for an integer of one of n, 2n−2, and 2n), or which may consist of a solvent and a silicon compound (in particular, a modified silane compound) represented by the formula $Si_aX_bY_c$ (X stands for a hydrogen atom and/or a halogen atom, Y stands for a boron atom or a phosphorus atom, the subscript a stands for an integer of 3 or more, the subscript c stands for an integer of 1 to a, and the subscript b stands for an integer of a to 2a+c+2). In particular, in the structure of a solar battery, a coating composition comprising the cyclic silicon compound (in particular, a silane compound) represented by the formula $Si_nX_m$ described above is used to form an i-type conductive silicon film, and a coating composition which may consist of a silicon compound (in particular, a modified silane compound) represented by the formula $Si_aX_bY_c$ described above is used to form a p-type or an n-type conductive silicon film.

As the coating composition described above, a liquid composition may be used which may consist of a solvent and a mixture at an optional mixing ratio of a silicon compound (a non-modified silane compound) represented by the formula $Si_nX_m$ described above and a silicon compound (in particular, a modified silane compound) represented by the formula $Si_aX_bY_c$ described above. Accordingly, a p-type or an n-type silicon film can be obtained, in which the carrier concentration is controlled.

The step of converting the coating film into a silicon film by heat treatment and/or light treatment, described above, may further may consist of a removing step of removing a solvent in the coating film by heat treatment and a converting step of converting the coating film into an amorphous silicon film by heat treatment at a higher temperature than that in the removing step and/or light treatment.

The amorphous silicon film described above may be converted into a polycrystalline silicon film by laser annealing and/or lamp annealing.

The solvent for the coating composition described above is preferably a hydrocarbon solvent having a vapor pressure of 0.001 to 200 mm Hg at room temperature in view of handling.

The coating composition may be coated by using an inkjet printer head. In the case mentioned above, the viscosity thereof is preferably 1 to 50 mPa·s, and the surface tension thereof is preferably 20 to 70 dyn/cm.

In the silicon compound (in particular, a silane compound) represented by the formula $Si_nX_m$ (X stands for a hydrogen atom and/or a halogen atom, the subscript n stands for an integer of 5 or more, and the subscript m stands for an integer of n, 2n−2, or 2n), the subscript n is preferably 5 to 20. In addition, in view of handling, the silicon compound described above is preferably a compound in which the subscript n is 5 or 6 or is preferably a mixture thereof.

In the silicon compound (in particular, a modified silane compound) represented by the formula $Si_aX_bY_c$ (X stands for a hydrogen atom and/or a halogen atom, Y stands for a boron atom or a phosphorus atom, the subscript a stands for an integer of 3 or more, the subscript c stands for an integer of 1 to a, and the subscript b stands for an integer of a to 2a+c+2) is preferably a compound in which the sum of a and c is approximately 5 to 20 or is preferably a mixture thereof.

In particular, in view of handling, the silicon compound described above is preferably a compound in which the sum of a and c is 5 or 6 or is preferably a mixture thereof.

In a preferable embodiment of the method for manufacturing a solar battery of the present invention, the formation of electrodes and conductive films used for wiring connected to the electrodes, may consist of a step of forming a coating film on a substrate by coating a liquid material containing a metal, a step of heating the coating film so that the coating film is converted into a metal film, and a step of patterning the coating film and/or the metal film. The formation of the electrodes and the conductive films described above may be performed by, for example, a step of forming a metal film on a substrate by plating, and a step of patterning the metal film. The formation of the electrodes and the conductive films described above may be performed by, for example, a step of forming a coating film on a substrate by coating a liquid material composed of an organic compound containing indium and tin, a step of heating the coating film so that the coating film is converted into an indium-tinoxide (ITO) film, and a step of patterning the coating film and/or the ITO film.

When the wiring is formed connected to the electrode, when necessary, insulating films are formed. The formation of the insulating films may be performed by a step of forming a coating film on a substrate by coating a liquid material containing a polysilazane, a step of heating the coating film so that the coating film composed of a polysilazane is converted into a $SiO_2$ film, and a step of patterning the coating film and/or the $SiO_2$ film.

In a preferable embodiment of the method for forming a solar battery of the present invention, it is particularly preferable that substantially all processes for forming films including silicon films, electrodes, conductive films, and insulating films be performed by using starting materials composed of liquid materials, and vapor phase depositions and vacuum processes be not employed. According to the method described above, large scale and expensive vacuum processes are omitted, and solar batteries can be manufactured at lower cost compared to that of conventional ones.

In the step of coating the coating composition and/or the liquid material, according to the present invention, coating may be performed by using an inkjet printer head while patterning is performed. According to the method described above, since amounts of starting materials to be used can be minimized, it is particularly effective to perform cost reduction.

DETAILED DESCRIPTION OF PREFERRED EMBODIMENTS

Hereinafter, the present invention will be described in detail.

A liquid coating composition used in a method for manufacturing a solar battery of the present invention, may consist of a cyclic silicon compound, and in particular, a silane compound preferably represented by the formula $Si_nX_m$ (the subscript n stands for an integer of 5 or more, the subscript m stands for an integer of n, 2n−2, or 2n, and X stands for a hydrogen atom and/or halogen atom).

In particular, as the silicon compound represented by the formula $Si_nX_m$, the subscript n is preferably 5 to 20, and the subscript n is more preferably 5 or 6. When the subscript n is less than 5, the silicon compound itself is unstable by strain generated by the cyclic structure thereof, so that the handling thereof is difficult, and when the subscript n is more than 20, the solubility of the silicon compound is decreased due to the cohesion force thereof, and it becomes difficult to select a usable solvent in practice.

As particular examples of the silicon compound, there may be mentioned cyclopentasilane, silylcyclopentasilane, cyclohexasilane, silylcyclohexasilane, and cycloheptasilane as a silane compound having one cyclic structure, and 1,1'-biscyclobutasilane, 1,1'-biscyclopentasilane, 1,1'-biscyclohexasilane, 1,1'-biscycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2,2]pentasilane, spiro[3,3]heptasilane, spiro[4,4]nonasilane, spiro[4,5]decasilane, spiro[4,6]undecasilane, spiro[5,5]undecasilane, spiro[5,6]dodecasilane, and spiro[6,6]tridecasilane as a silane compound having two cyclic structures.

In addition, as polycyclic hydrogenated silane compounds, compounds 1 to 5 represented by the formulas shown below may be mentioned.

Compound 1

Compound 2

Compound 3

Compound 4

Compound 5

Furthermore, in addition to these hydrogenated silane compounds mentioned above, silane compounds are mentioned in which some of the hydrogen atoms of the silane compounds mentioned above is substituted with a $SiH_3$ group or a halogen atom. These silane compounds may be used in combination. Among those mentioned above, in view of solubility in a solvent, 1,1'-biscyclopentasilane, 1,1'-biscyclohexasilane, spiro[4,4]nonasilane, spiro[4,5] decasilane, spiro[5,5]undecasilane, spiro[5,6]dodeca silane, and silane compounds having $SiH_3$ groups on the structures of the silane compounds mentioned above are particularly preferable.

In the present invention, when a composition which may consist of a cyclic silicon compound represented by the formula $Si_nX_m$ is used, a silane compound, such as n-pentasilane, n-hexasilane, n-heptasilane, or the like may be contained in the composition.

In addition, in the method for manufacturing a solar battery of the present invention, it is also preferable that a liquid coating composition containing a silicon compound represented by the formula $Si_aX_bY_c$ described above be used. In the formula mentioned above, X stands for a hydrogen atom or a halogen atom, such as a fluorine atom, a chlorine atom, a bromine atom, or an iodine atom, and Y in the formula stands for a boron atom or a phosphorus atom. When a modified silane compound is pyrolyzed, photolyzed, or in addition, is further processed by laser irradiation, in an inert gas atmosphere or in a reducing gas atmosphere, the modified silane compound is converted into silicon modified by boron atoms or phosphorus atoms. In the formula, the subscripts a, b, and c have the following relationship, that is, the subscript a is an integer of 3 or more, the subscript b is an integer of a to 2a+c+2, and the subscript c is an integer of 1 to a. When the subscript a is less than 3, it is difficult to obtain a superior coating film of the modified silane compound by a coating method since the modified silane compound is in a gas or a liquid form.

In particular, as a silicon compound represented by the formula $Si_aX_bY_c$ described above, a+c is preferably 5 to 20, and a+c is more preferably 5 or 6. When a+c is less than 5, it is difficult to handle the silicon compound since the compound is unstable due to strain generated in the cyclic structure thereof. On the other hand, when a+c is more than 20, solubility of the silicon compound is decreased due to cohesion force thereof, and it becomes difficult to select a usable solvent in practice.

As particular examples of the modified silane compounds represented by the formula $Si_aX_bY_c$ described above, compounds 6 to 27 represented by the formulae shown below may be mentioned.

In the compounds 8, 9, 10, 18, 19, and 20, the subscript n is an integer of 0 or more, and in the compounds 26 and 27, the subscript m is an integer of 2 or more. By the formulas shown above, the only compounds modified by boron are shown; however, as a silane compound modified by phosphorous, modified silane compounds modified by a phosphorous atom are mentioned which have the same structures as those modified by a boron atom.

In the present invention, the modified silane compound described above may be used alone as a silicon compound in a solution (composition) or may be used in combination with the non-modified silane compound described above. The mixing ratio of the modified silane compound and the non-modified silane compound changes in accordance with the content of the modifying atom, such as a boron or a phosphorus atom; however, the ratio of the modifying atom to the silicon atom is approximately 1 ppb to 25%.

In the method of the present invention, a solution is coated on a substrate, which is composed of a solvent dissolving a silicon compound (a non-modified silane compound) represented by the formula $Si_nX_m$ and a silicon compound represented by the formula $Si_aX_bY_c$ (a modified silane compound). The solvent used in the present invention generally has a vapor pressure of 0.001 to 200 mm Hg at room temperature. When the vapor pressure of a solvent is more than 200 mm Hg, since the solvent is vaporized before a coating film is formed, it is difficult to form a superior coating film. On the other hand, when the vapor pressure of a solvent is less than 0.001 mm Hg, since drying is slow and the solvent easily tends to remain in the coating film, a superior coating film composed of a silicon compound and a modified silicon compound is difficult to obtain even by heating and/or light irradiation in the following step.

A solvent used in the present invention is not specifically limited so long as the solvent dissolves the silane compound described above and/or the modified silane compound described above and will not react with the solute dissolved therein. As examples of the solvents, in addition to hydrocarbon solvents, such as n-pentane, n-hexane, n-heptane, n-octane, n-decane, dicyclopentane, benzene, toluene, xylene, durene, indene, tetrahydronaphthalene, decahydronaphthalene, and squalane, there may be mentioned, for example, diethyl ether, dipropyl ether, ethyleneglycol dimethyl ether, ethyleneglycol diethyl ether, ethyleneglycol methyl ethyl ether, diethyleneglycol dimethyl ether, diethyleneglycol diethyl ether, diethyleneglycol methyl ethyl ether, tetrahydrofuran tetrahydropyran, p-dioxane, and tetrahydrofuran as ether solvents, and propylene carbonate, γ-butyrolactone, N-methyl-2-pyrrolidone, dimethylformamide, acetonitril, dimethyl sufoxide, methylene chloride, and chloroform as polar solvents. Among those mentioned above, in view of solubility of silane compounds and stability of the solution, hydrocarbon solvents and ether solvents are preferable, and as more preferable solvents, hydrocarbon solvents may be mentioned. These solvents may be used alone or in combination. In particular, hydrocarbon solvents are preferable since solubility of a silicon compound is improved and remaining thereof during heating or light irradiation, described later, is suppressed.

As the coating composition used in the present invention, a composition only containing the non-modified silicon compound described above as a solute, a composition only containing the modified silicon compound described above, or a composition containing both silicon compounds may be used. A coating composition can be optionally prepared in accordance with a desired coating method and a desired silicon thickness, which is composed of the solvent mentioned above and generally has a solute at a concentration of approximately 1 to 80%. The solution thus prepared containing the modified silicon compound has a viscosity of 1 to 500 mPa·s. When the viscosity is less than 1 mPa·s, coating is difficult to perform, and when the viscosity is more than 500 mPa·s, it is difficult to obtain a coating film having a smooth surface. In particular, when coating is performed by an inkjet printer head, the viscosity is preferable 1 to 50 mPa·s.

The solution described above may contain a small amount of a surface tension adjuster, such as a fluorine-based, a silicone-based, or a nonionic adjuster, so long as the objective functions are not degraded. The nonionic surface tension adjuster is effective to improve wettability of the solution on a material to be coated, to improve leveling properties of the coated film, and to prevent the coated film from forming a concavo-convex form and an orange skinlike surface, i.e., a rough surface.

In steps for forming silicon films used for the method for manufacturing a solar battery of the present invention, gases are not supplied differing from the case of CVD methods which are generally employed, but after the liquid coating composition described above is coated on a substrate, a coating film are formed by evaporating the solvent, and the coating film is converted into a silicon film by pyrolysis and/or photolysis, or the coating film is converted into a polycrystalline silicon film by pyrolysis and/or photolysis followed by laser treatment.

In addition, without performing ion implantation in vacuum on the silicon film modified by boron atoms or phosphorus atoms, a p-type or an n-type silicon film is formed. As a coating method of the coating composition described above, a spin coating method, a roll coating method, a curtain coating method, a dip coating method, a spray coating method, an inkjet method, or the like may be used. Coating is generally performed at room temperature or above. When coating is performed at below room temperature, solubility of silane compound is decreased, and hence, some of the silane compound may be precipitated in some cases. An environment in which coating is performed is preferably an inert gas atmosphere, such as nitrogen, helium, or argon. In addition, when necessary, a reducing gas, such as hydrogen, is preferably mixed therewith. When a spin coating method is used, the rotation rate of a turntable is determined by the thickness of a thin film to be formed and the coating composition; however, in general, the number of rotation is 100 to 5,000 rpm, preferably, 300 to 3,000 rpm. After coating, heating is performed in order to remove the solvent. The heating temperature changes in accordance with the type of solvent, and the boiling point thereof; however, in general, it is 100 to 200° C. An environment is preferably an atmosphere of inert gas, such as nitrogen, helium, or argon, as is the case with the coating step described above.

The coating composition used in the present invention is a composition to be converted into a silicon film by heating and/or light irradiation from a coating film of the composition formed beforehand, and the silicon film obtained thereby is composed of amorphous or polycrystalline silicon. In the step of heating, in general, when a maximum temperature is 550° C. or less, an amorphous silicon film is obtained, and when a maximum temperature is above 550° C., a polycrystalline silicon film is obtained. In order to obtain an amorphous silicon film, the temperature is preferably 300 to 550° C., and the temperature is more preferably 350 to 500° C. When a maximum temperature is less than 300° C., pyrolysis of a silane compound may not proceed sufficiently, and hence, a silicon film provided with satisfactory properties may not be obtained in some cases. As an environment in which heating is performed, an inert gas atmosphere, such as nitrogen, helium, or argon, or an atmosphere containing a reducing gas, such as hydrogen, is preferable. In order to obtain a polycrystalline silicon film, the amorphous silicon film thus obtained can be converted into a polycrystalline silicon film by irradiating a laser. An environment, in which laser irradiation is performed, is preferably an atmosphere containing no oxygen, such as an inert gas atmosphere of nitrogen, helium, argon, or the like, or an atmosphere of the inert gas mentioned above containing a reducing gas, such as hydrogen.

Light treatment can be performed on a coating film composed of the composition (solution) containing a silicon compound in an inert gas atmosphere before the solvent is removed and/or after the solvent is removed. A solvent-soluble silicon compound is not only converted into a solvent-insoluble rigid coating film by a reaction induced by light treatment, but also, it can be converted into a silicon film having superior optical electric properties by light treatment or by light treatment performed simultaneously with heating.

As a light source used in irradiation, in addition to a low pressure or a high pressure mercury lamp, a deuterium lamp, and a discharge light of a rare gas, such as argon, krypton, or xenon, YAG laser, argon laser, carbon dioxide laser, or excimer laser of, such as XeF, XeCl, XeBr, KrF, KrCl, ArF, or ArCl, may be mentioned. A light source having an output of 10 to 5,000 W is generally used; however, an output of 100 to 1,000 W is commonly sufficient. The wavelength of the light source is not specifically limited so long as it is absorbed to some extent in a silicon compound contained in the coating composition described above; however, the wavelength thereof is generally 170 to 600 nm, and in particular, a wavelength of 170 to 380 nm is preferable in view of absorption efficiency. In addition, in view of conversion efficiency into a silicon film, in particular, laser light is preferably used. A temperature during irradiation is normally room temperature to 500° C., and a temperature is optionally determined in accordance with semiconductor characteristics of a silicon film to be obtained.

A substrate which is coated with a coating composition used in the present invention is not specifically limited. As a substrate which can be used, there may be mentioned, in addition to a common quartz, borosilicate glass, and soda-lime glass, a metal substrate, such as gold, silver, copper, nickel, titanium, aluminum, or tungsten, and glass substrate and a plastic substrate, which are provided thereon with a conductive metal layer composed of the metal mentioned above or with a conductive metal oxide film such as ITO.

An apparatus for carrying out the method of the present invention described above is schematically shown in FIG. 1 and FIGS. 2(a)–2(c) FIG. 1 is an example of an apparatus provided with a spin coater 11 and an infrared lamp 14 in an inert gas atmosphere. In the inert gas atmosphere, such as a nitrogen gas atmosphere, a coating composition containing the silane compound described above is dripped on a substrate 12, is uniformly coated by the spin coater 11, and is then dried. Subsequently, the composition thus coated is heated at predetermined conditions by the infrared lamp 14, whereby an amorphous silicon thin film 13 can be formed. Impurity concentration and conductive characteristics of the silicon thin film 13 can be controlled by a mixing ratio of the silane compound and the modified silane compound contained in the coated coating composition. In addition, the thickness of the silicon thin film can be controlled by the rotation rate of the spin coater, viscosity of the solution, concentration thereof, and the like.

Figure 1:
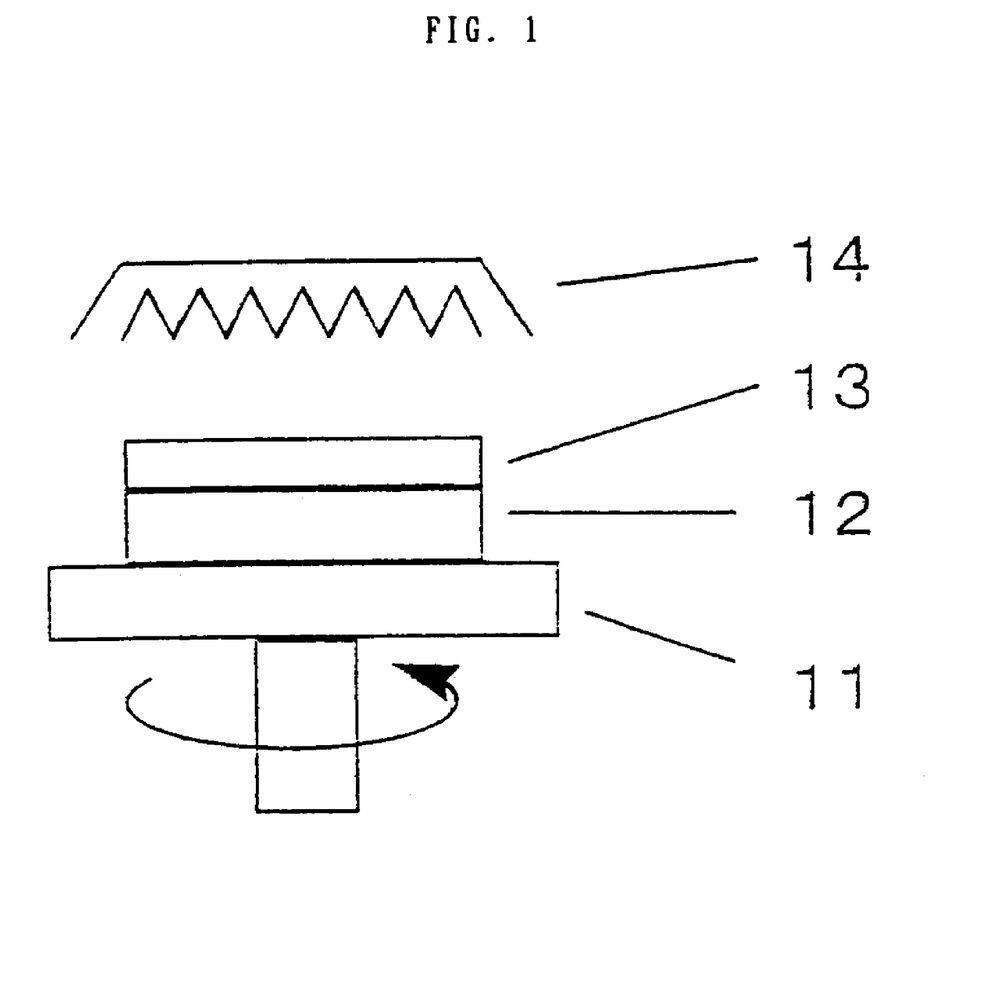
FIG. 1 is a schematic view showing an example of an apparatus for carrying out a method of the present invention.
Figure 2:
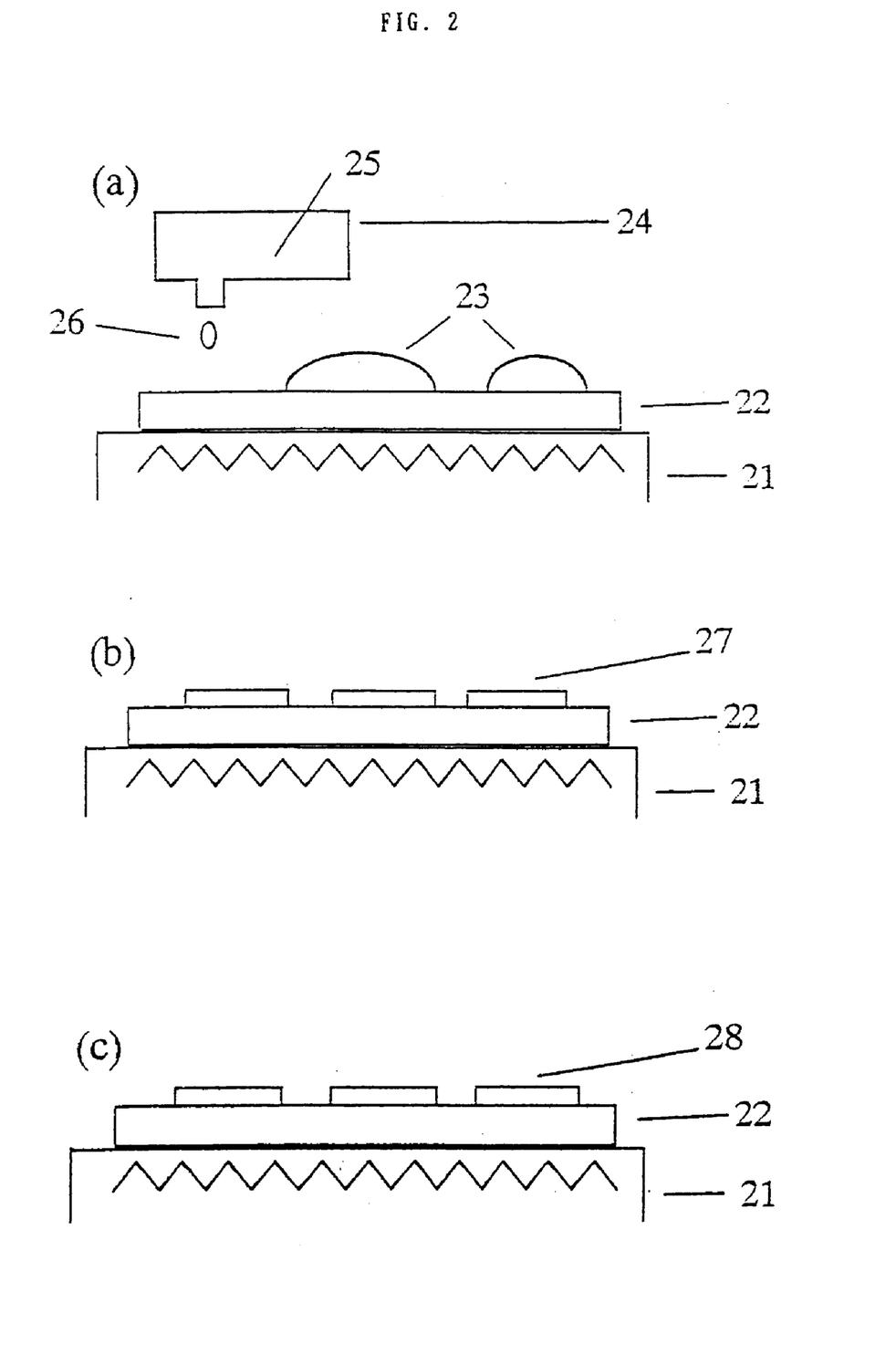
FIGS. 2a–2c are schematic views showing another example of an apparatus for carrying out a method of the present invention.

FIGS. 2(a)–2(c) show schematic views of an example of an apparatus for forming an amorphous silicon film, in which a droplet 26 of the coating composition 25 described above containing a silane compound is coated on a substrate 22 using an inkjet printer head 24 in an inert gas atmosphere, and the coating is simultaneously patterned (FIG. 2a), the coating composition 27 coated on the substrate is then dried so as to remove the solvent (FIG. 2b), and subsequently, by heating the substrate on a hot plate 21, an amorphous silicon film 28 is formed (FIG. 2c). When the solution is coated by the inkjet printer head, since coating can be uniformly performed only on desired locations, there is a feature which can minimize the amount of the starting material to be used. In addition, in this step, the film thickness thereof can be controlled by operating conditions of the printer head and the concentration and viscosity of the solution.

A solar battery generally has a structure in which at least 2 layers, which are selected from an i-type, a p-type, and an n-type semiconductor thin film, are provided between a pair of electrodes so as to form a semiconductor junction, such as pn, pin, ip, and in. Also, in the method for manufacturing a solar battery of the present invention, in order to form semiconductor junctions as mentioned above, by repeatedly performing the method described above for forming a silicon thin film of an i-type, a p-type, or an n-type, an optional semiconductor junction can be formed.

Electrodes, conductive films for wiring, and when necessary, insulating films to be used, which are used in the solar battery in the present invention, are not specifically limited. For example, a metal film which is usually used for a solar battery, a transparent conductive film such as ITO, and an insulating film composed of, for example, $SiO_2$, can be used. In addition, as forming methods therefor, a common deposition method, a sputtering method, and a CVD method can be used. However, in consideration of the feature of the method of the present invention in which a silicon film is formed by a liquid material that requires no vacuum process, formations of conductive films and insulating films are preferably performed by liquid materials that require no vacuum process. As a method for forming a conductive film by a liquid material, there may be mentioned, for example, a method using a slurry having metal particles dispersed in an organic solvent, a plating method, and a method for forming an ITO thin film by heating after coating an organic compound containing indium and tin. As a method for forming an insulating film, a method may be mentioned as an example, in which, after a polysilazane is coated on a substrate, the coating film thereof is converted into a film composed of $SiO_2$ by heating.

In the method for manufacturing a solar battery of the present invention, the silicon film, the conductive film, and the insulating film, may be patterned in some cases after these films are formed, and as a method for patterning, a common method, such as a mask method or a lithographic method, may be used. However, in consideration of the feature of the present invention in which a film is formed by coating a liquid material, it is particularly preferable that coating of a liquid material and patterning thereof be simultaneously performed by using an inkjet printer head. According to an inkjet method, since an amount of a starting material to be used can be minimized, it is particularly effective in reducing the manufacturing cost of the solar battery. In addition, when the electrodes, conductive films, and the insulating films are formed by using liquid materials, it is particularly preferable that coating and pattering be simultaneously performed by an inkjet method.

Hereinafter, the present invention will be described in detail with reference to examples; however, the present invention will not be limited thereto.

EXAMPLE 1

On a quartz substrate (31) having a transparent conductive film ITO (32) formed thereon, a solar battery having a structure schematically shown in FIG. 3 was formed in accordance with Steps 1-1 to 1-4 described below.
(Step 1-1)
In order to form a p-type silicon film, 1 mg of a boron modified silane compound, i.e., 1-borahexaprismane (compound 14), and 1 g of cyclohexasilane were dissolved in 20 g of toluene, thereby preparing a coating solution. The viscosity thereof was 5.5 mPa·s. The solution was spin-coated in an argon atmosphere on the quartz substrate 31 provided with the ITO described above and was dried at 150° C., and pyrolysis was performed at 450° C. in an argon atmosphere containing 3% hydrogen, thereby yielding a p-type amorphous silicon film 33 having a thickness of 60 mn.

(Step 1-2)

Next, in order to form an i-type silicon film, 2 g of 1,1'-biscyclopentasilane was dissolved in a mixed solvent of 10 g of toluene and 10 g of xylene, thereby preparing a coating solution. The viscosity of the solution was 6.5 mPa·s. The solution was spin-coated on the substrate described above and was dried at 150° C. in an argon atmosphere, and pyrolysis was performed at 450° C. in an argon atmosphere containing 3% hydrogen, thereby yielding an i-type amorphous silicon film 34 having a thickness of 100 nm on the p-type amorphous silicon film 33.

(Step 1-3)

Next, in order to form an n-type silicon film, 1 mg of phosphorous modified silane compound, i.e., 1-phosphocyclopentasilane, and 1 g of octasilacubane (compound 2) were dissolved in a mixed solvent of toluene in an amount of 10 g and tetrahydronaphthalene, thereby preparing a coating solution. The viscosity of the solution was 7.2 mPa·s. The solution was spin-coated in an argon atmosphere on the substrate described above and was dried at 150° C., and pyrolysis was then performed at 450° C. in an argon atmosphere containing 3% hydrogen, thereby yielding an n-type amorphous silicon film 35 having a thickness of 60 nm on the i-type amorphous silicon film 34.

(Step 1-4)

Figure 3:
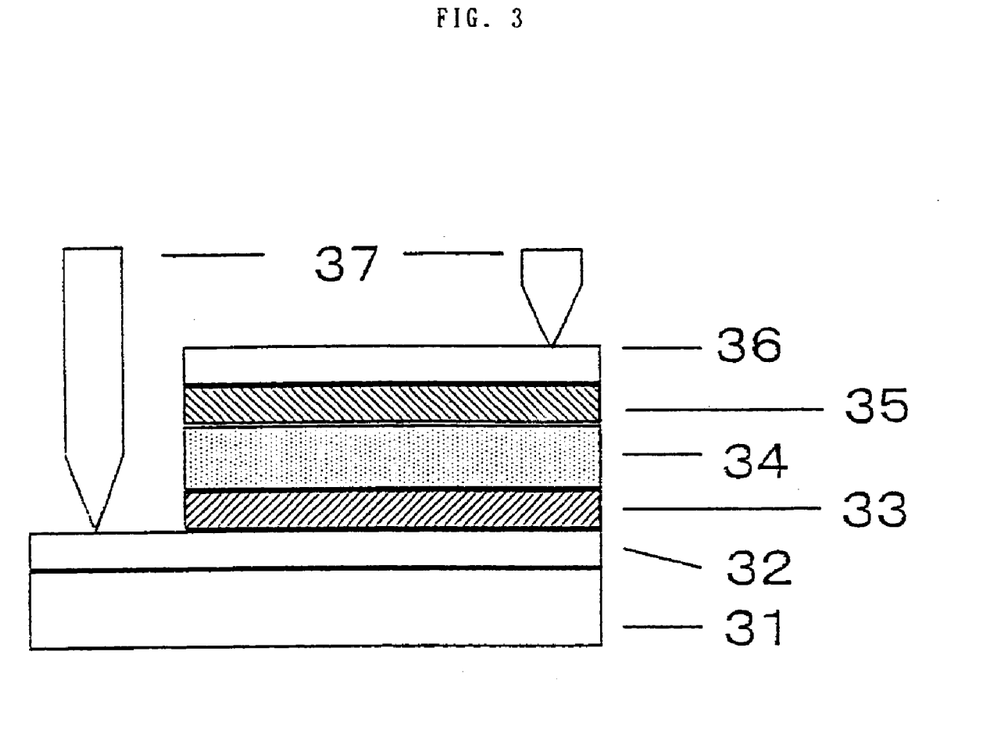
FIG. 3 is a cross-sectional view showing an example of a solar battery manufactured in an example of the present invention.

On a part of the thin film having a pin junction structure thus formed, an aluminum film 36 having a thickness of 300 nm was deposited using a mask, and the thin film provided with no aluminum film was etched so as to expose the ITO film 32 disposed thereunder, whereby a solar battery having a structure as shown in FIG. 3 was formed.

When the photoelectromotive force of the solar battery thus formed was measured so as to obtain the conversion efficiency thereof, it was 4.5%.

EXAMPLE 2

A solar battery having a structure shown in FIG. 3 was formed in a manner equivalent to that in Example 1 except that liquid materials and processing methods in the steps of forming the solar battery in Example 1 were changed as described below (Steps 1-1 to 1-3 were changed to Steps 2-1 to 2-3).

(Step 2-1)

A solution was prepared which has a viscosity of 5 mPa·s formed of 1 mg of a boron modified silane compound, i.e., 1-boraoctasilacubane (compound 12), and 1 g of silylcyclopentasilane dissolved in 20 g of toluene. The solution thus formed was spin-coated on a substrate in an argon atmosphere containing 3% hydrogen, and while being dried at 150° C., irradiation was performed thereon by using a high pressure mercury lamp of 500 W for 5 minutes. Subsequently, heating was performed under the same condition as that in Step 1-1, thereby yielding a p-type amorphous silicon film.

(Step 2-2)

A solution was prepared which has a viscosity of 7 mPa·s formed of 1 g of 1,1'-biscyclohexasilane and 1 g of 1,1'-biscyclopentasilane dissolved in 20 g of tetrahydronaphthalene. The solution thus formed was spin-coated on the substrate in an argon atmosphere containing 3% hydrogen, and subsequently in the same atmosphere as mentioned above, while the substrate was maintained at room temperature, irradiation was performed by using a high pressure mercury lamp of 500 W for 30 minutes. Heating was then performed under the same condition as that in Step 1-2, thereby yielding an i-type amorphous silicon film.

(Step 2-3)

By using a solution having a viscosity of 6.5 mPa·s obtained by dissolving 1 mg of a mixture formed of 1-phosphocyclohexasilane and 1-phosphocyclopentasilane in 20 g of toluene, the same processing was performed as was described in Step 1-3, thereby yielding an n-type amorphous silicon film.

Subsequently, an upper electrode was formed in a manner equivalent to that described in Step 1-4, whereby a solar battery having a structure shown in FIG. 3 was formed.

When the photoelectromotive force of the solar battery thus formed was measured so as to obtain the conversion efficiency thereof, it was 3.5%.

EXAMPLE 3

A solar battery having a structure shown in FIG. 3 was formed in a manner equivalent to that in Example 1 except that liquid materials used in the steps of forming the solar battery in Example 1 were changed as described below (Steps 1-1 to 1-3 were changed to Steps 3-1 to 3-3).

(Step 3-1)

By using a solution having a viscosity of 3.2 mPa·s obtained by dissolving 1 mg of 1-boracyclopentasilane (compound 6 described above) and 1 g of cyclopentasilane in a mixed solvent of 30 g of tetrahydronaphthalene and 10 g of decahydronaphthalene, the same processing was performed as was described in Step 1-1, thereby yielding a p-type amorphous silicon film.

(Step 3-2)

By using a solution having a viscosity of 3.2 mPa·s obtained by dissolving 1 g of cyclohexasilane in a mixed solvent of 30 g of tetrahydronaphthalene and 10 g of decahydronaphthalene, the same processing was performed as was described in Step 1-2, thereby yielding an i-type amorphous silicon film.

(Step 3-3)

By using a solution having a viscosity of 3.2 mPa·s obtained by dissolving 1 mg of 1-phosphocyclopentasilane and 1 g of cyclopentasilane in a mixed solvent of 30 g of tetrahydronaphthalene and 10 g of decahydronaphthalene, the same processing was performed as was described in Step 1-3, thereby yielding an n-type amorphous silicon film.

Subsequently, an upper electrode was formed in a manner equivalent to that described in Step 1-4, whereby a solar battery having a structure shown in FIG. 3 was formed. When the photoelectromotive force of the solar battery thus formed was measured so as to obtain the conversion efficiency thereof, it was 5%.

EXAMPLE 4

A solar battery having a structure shown in FIG. 3 was formed in a manner equivalent to that in Example 3 except that Steps 3-1 to 3-3 in Example 3 for forming a solar battery were changed to Steps 4-1 to 4-3 so the an amorphous silicon film formed was converted into a polycrystalline film by laser irradiation.

(Step 4-1)

After a p-type amorphous silicon film was formed in a manner equivalent to that in Step 3-1, excimer laser having a wavelength of 308 nm was irradiated on the ptype amorphous silicon film at an energy density of 320 $mJ/cm^2$ in an argon atmosphere, thereby converting the p-type amorphous silicon film into a p-type polycrystalline silicon film.

(Step 4-2)

After an i-type amorphous silicon film was formed on the p-type polycrystalline silicon film in a manner equivalent to that in Step 3-2, excimer laser having a wavelength of 308 nm was irradiated on the i-type amorphous silicon film at an energy density of 320 mJ/cm$^2$ in an argon atmosphere, thereby converting the i-type amorphous silicon film into an i-type polycrystalline silicon film.

(Step 4-3)

After an n-type amorphous silicon film was formed on the i-type polycrystalline silicon film in a manner equivalent to that in Step 3-3, excimer laser having a wavelength of 308 nm was irradiated on the n-type amorphous silicon film at an energy density of 320 mJ/cm$^2$ in an argon atmosphere, thereby converting the n-type amorphous silicon film into an n-type polycrystalline silicon film.

Subsequently, electrodes were formed in a manner equivalent to that in Step 1-4, whereby a solar battery having a structure composed of polycrystalline silicon films shown in FIG. 3 was formed. When the photoelectromotive force of the solar battery thus formed was measured so as to obtain the conversion efficiency thereof, it was 8.5%.

EXAMPLE 5

A solar battery was formed in a manner equivalent to that in Example 4 except that excimer laser irradiations performed 3 times in an argon atmosphere in Example 4 were performed in the atmosphere. When the photoelectromotive force of the solar battery thus formed was measured so as to obtain the conversion efficiency thereof, it was 5.5%.

EXAMPLE 6

Figure 4:
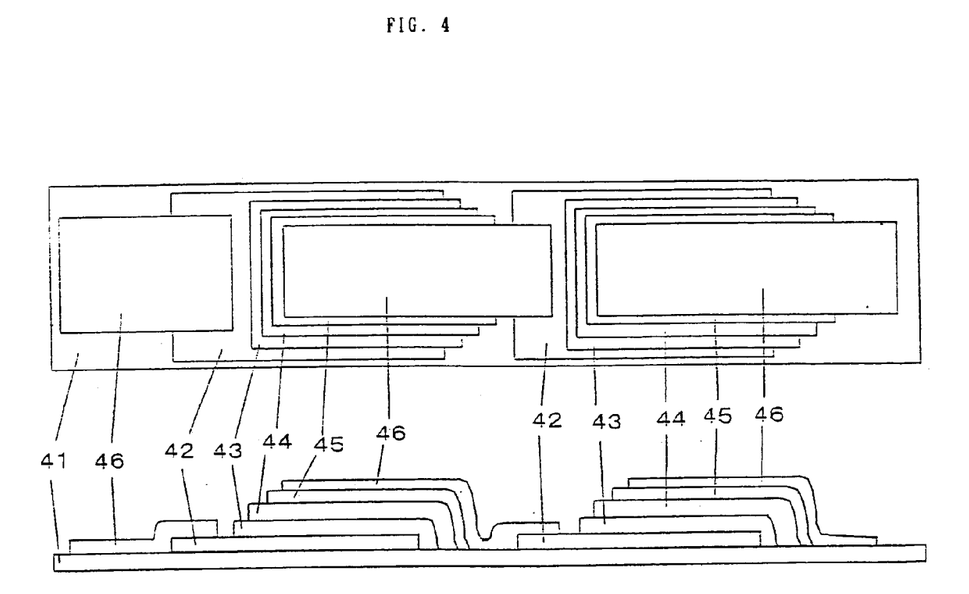
FIG. 4 is a cross-sectional view showing an example of a solar battery manufactured in another example of the present invention.

A liquid material composed of an organic compound containing indium and tin was pattern-coated on a glass substrate 41 by an inkjet method so as to be 42 in FIG. 4, and the coating pattern thus formed is converted into an ITO (indium-tin-oxide) film by heating, thereby forming a pattern 42 shown in FIG. 4. Next, the liquid material used in Step 4-1 was pattern-coated by an inkjet method, and a p-type polycrystalline silicon having a pattern 43 was formed by heating and laser irradiation in a manner equivalent to that in Step 4-1. Subsequently, the liquid material used in Step 4-2 was pattern-coated by an inkjet method, and an i-type polycrystalline silicon having a pattern 44 was formed by heating and laser irradiation in a manner equivalent to that in Step 4-2. In addition, the liquid material used in Step 4-3 was pattern-coated by an inkjet method, and an n-type polycrystalline silicon having a pattern 45 was formed by heating and laser irradiation in a manner equivalent to that in Step 4-3. An aluminum film 46 was deposited by using a mask on the laminated pattern of the pin polycrystalline silicon thus formed, whereby a solar battery was formed which is composed of polycrystalline silicon having a structure shown in FIG. 4 in which a plurality of wide elements are connected with each other in series. When the photoelectromotive force of the solar battery thus formed was measured so as to obtain the conversion efficiency thereof, it was 7.5%.

EXAMPLE 7

In order to form every film by using liquid materials so as to realize a method for forming a solar battery without using vacuum processes, a solar battery shown in FIG. 4 was formed as was the case with Example 6 by changing only the step in Example 6 for depositing an aluminum film using a mask to methods (1) to (3) described below. The method (1) was a method for coating a solution, in which the solution formed by adding an organic solvent to a silver paste to have a viscosity of 20 mPa·s was coated by an inkjet method so as to form the pattern 46 and was then dried. The method (2) was a method for forming an ITO film in the form of the pattern 46 by an inkjet method in a manner equivalent to that used for a lower electrode in Example 6. The method (3) was a method for selectively plating nickel only on the pattern 46. In a solar battery formed according to one of the methods (1) to (3), the conversion efficiency was 7.5% equal to that in Example 6.

EXAMPLE 8

Figure 5:
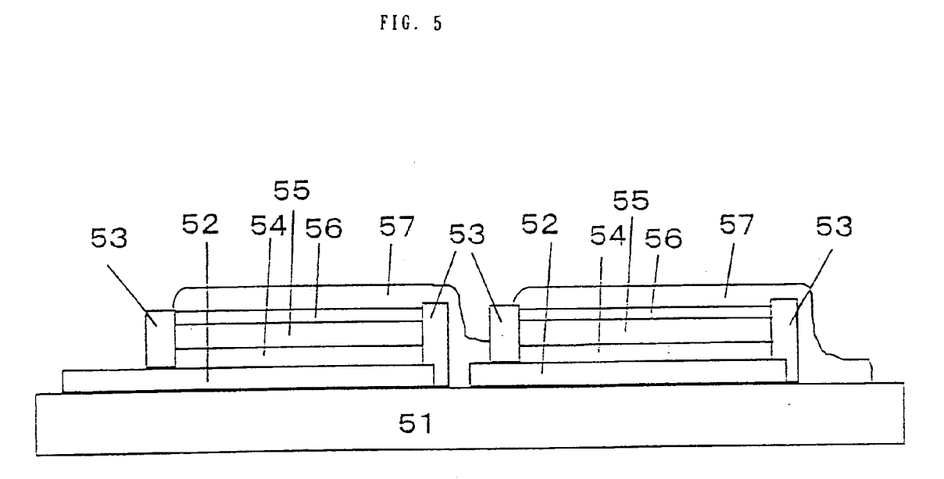
FIG. 5 is a cross-sectional view showing an example of a solar battery manufactured in still another example of the present invention.

A solar battery having a structure shown in FIG. 5 was formed on a glass substrate 51 by only using liquid materials and an inkjet method. First, an ITO film 52 was formed as a lower electrode in a manner equivalent to that in Example 6. Next, a polysilazane solution was pattern-coated by an inkjet method and was then converted by heating into an insulating film composed of SiO$_2$ having a shape shown by numeral 53. An entire inside area enclosed by this SiO$_2$ film was pattern-coated by an inkjet method with the liquid solution used in Step 4-1, and a p-type polycrystalline silicon film 54 was then formed by heating and laser irradiation in a manner equivalent to that in Step 4-1. Subsequently, the liquid material used in Step 4-2 was pattern-coated on the p-type polycrystalline silicon film 54 by an inkjet method, and an i-type polycrystalline silicon film 55 was then formed by heating and laser irradiation in a manner equivalent to that in Step 4-2. In addition, the liquid material used in Step 4-3 was pattern-coated on the i-type polycrystalline silicon film 55 by an inkjet method, and an m-type polycrystalline silicon film 56 was then formed by heating and laser irradiation in a manner equivalent to that in Step 4-3. By patterncoating of an ITO film in a manner equivalent to that used for the lower electrode in Example 6 on the pin junction structure shown in FIG. 5 thus formed, a shape 57 is formed, whereby a solar battery having a structure shown in FIG. 5 was formed. When the photoelectromotive force of the solar battery thus formed was measured so as to obtain the conversion efficiency thereof, it was 9%.

As has thus been described in detail, according to the method of the present invention, in the manufacture of solar batteries, since silicon thin films are formed by novel coating processes using liquid materials, steps using CVD processes in vacuum and ion implantation processes, which conventionally require large and expensive apparatuses, are not necessary. In addition, since, by using an inkjet printer head, a liquid material is coated only on desired areas while patterning is performed, consumptions of starting materials can be minimized. As a result, in the manufacture of solar batteries, significant resource conservation and energy conservation can be realized, and large solar batteries can be manufactured at lower cost, which has been considered to be impossible.

What is claimed is:

1. A method for manufacturing a solar battery having at least two semiconductor thin-films and at least one conductive film, each of the semiconductor thin-films differing from the other in at least one of impurity concentration thereof and type of semiconductor, comprising steps of:

a) forming at least one of the semiconductor thin-films, said step comprising:

a sub-step of coating a liquid coating composition containing a silicon compound so as to form a coating film; and a sub-step of converting the coating film into a silicon film by at least one of heat treatment and light treatment b) forming at least one conductive film, said step comprising:
a sub-step of forming a coating film on a substrate by coating a liquid material; and
a sub-step of heating the coating film to convert it into a solid conductive film.

2. The method for manufacturing a solar battery, according to claim 1, further comprising using a solvent and a cyclic silicon compound represented by formula $Si_nX_m$, in which X stands for at least one of a hydrogen atom and a halogen atom, subscript n stands for an integer of 5 or more, and subscript m stands for an integer of one of n, 2n−2, and 2n, as the liquid coating composition so as to form an i-type silicon thin-film as the semiconductor thin-film.

3. The method for manufacturing a solar battery, according to claim 2 the subscript n being 5 to 20 in the formula $Si_nX_m$.

4. The method for manufacturing a solar battery, according to claim 1, further comprising using a coating composition comprising a solvent and a modified silicon compound represented by formula $Si_aX_bY_c$, in which X stands for at least one of a hydrogen atom and a halogen atom, Y stands for one of a boron atom and a phosphorus atom, subscript a stands for an integer of 3 or more, subscript c stands for an integer of 1 to a, and subscript b stands for an integer of a to 2a+c+2, as the liquid coating composition so as to form one of a p-type and an n-type silicon thin-film as the semiconductor thin-film.

5. The method for manufacturing a solar battery, according to claims 4, the modified silicon compound represented by the formula $Si_aX_bY_c$, is one of a compound in which a sum of the subscript a and the subscript c is 5 or 6 and a mixture thereof.

6. The method for manufacturing a solar battery, according to claim 1, further comprising using a coating composition comprising a solvent and a mixture at an optional mixing ratio of a cyclic silicon compound represented by formula $Si_mX_m$, in which X stands for at least one of a hydrogen atom and a halogen atom, subscript n stands for an integer of 5 or more, and subscript m stands for an integer of one of n, 2n−2, and 2n, and a modified silicon compound represented by formula $Si_aX_bY_c$, in which X stands for at least one of a hydrogen atom and a halogen atom, Y stands for one of a boron atom and a phosphorus atom, subscript a stands for an integer of 3 or more, subscript c stands for an integer of 1 to a, and subscript b stands for an integer of a to 2a+c+2, as the liquid coating composition so as to form one of a ptype and an n-type silicon thin-film, in which carrier concentration thereof is controlled.

7. The method for manufacturing a solar battery, according to claim 1, the sub-step of converting the coating film into a silicon film by at least one of heat treatment and light treatment comprising:
a removing step of a solvent in the coating film by heat treatment; and
a converting step of converting the coating film into an amphorous silicon film by at least one of heat treatment at a higher temperature than that in the removing step and light treatment.

8. The method for manufacturing a solar battery, according to claim 7, the sub-step of converting the coating film further comprising a step of converting the amorphous silicon film into a polycrystalline silicon film by at least one of laser annealing and lamp annealing.

9. The method for manufacturing a solar battery, according to claim 1, a solvent for the coating composition being a hydrocarbon solvent having a vapor pressure of 0.001 to 200 mm Hg at room temperature.

10. The method for manufacturing a solar battery, according to claim 1, the coating composition having a viscosity of 1 to 50 mPa·s and a surface tension of 20 to 70 dyne/cm.

11. The method for manufacturing a solar battery, according to claim 1, the liquid material containing a metal.

12. The method for manufacturing a solar battery, according to claim 1, further comprising, as a step of forming an electrode and a conductive film used for wiring connected to the electrode:
a step of forming a metal film on a substrate by plating; and
a step of patterning the metal film.

13. The method for manufacturing a solar battery, according to claim 1, the liquid material composed of an organic compound containing indium and tin.

14. The method for manufacturing a solar battery, according to claim 1, further comprising:
a step of forming a coating film on a substrate by coating a liquid material containing a polysilazane;
a step of heating so that the coating film is converted into an $SiO_2$ film; and
a step of patterning at least one of the coating film and the $SiO_2$ film.

15. The method for manufacturing a solar battery, according to claim 1, substantially all processes for forming films including the silicon film and the conductive film being performed using liquid starting materials, in which vapor phase deposition and vacuum process are not employed.

16. The method for manufacturing a solar battery, according to claim 15, in a step of coating one of the coating composition and the liquid starting materials, coating being performed by using an inkjet printer head.

* * * * *